United States Patent
Prater

(10) Patent No.: US 6,249,237 B1
(45) Date of Patent: Jun. 19, 2001

(54) SYSTEM AND METHOD FOR BANDPASS SHAPING IN AN OVERSAMPLING CONVERTER

(75) Inventor: James S. Prater, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/169,812

(22) Filed: Oct. 9, 1998

(51) Int. Cl.[7] .................................... H03M 3/00
(52) U.S. Cl. .................. 341/143; 341/126; 341/144; 341/155
(58) Field of Search ................... 341/141, 143, 341/61, 131, 120, 145, 126, 150, 110, 111, 112, 113, 116, 117, 144, 155; 381/312; 375/25; 179/15.55 R; 702/190; 358/146

(56) References Cited

U.S. PATENT DOCUMENTS

| | | | |
|---|---|---|---|
| 4,270,026 | * 5/1981 | Shenoi et al. | 179/15.55 R |
| 5,155,743 | 10/1992 | Jacobs | 375/28 |
| 5,208,594 | * 5/1993 | Yamazaki | 341/143 |
| 5,323,157 | 6/1994 | Ledzius et al. | 341/143 |
| 5,561,424 | * 10/1996 | Norsworthy et al. | 341/126 |
| 5,600,649 | 2/1997 | Sharma et al. | 370/435 |
| 5,701,106 | 12/1997 | Pikkarainen et al. | 332/200 |
| 5,870,699 | * 2/1999 | Canada et al. | 702/190 |

\* cited by examiner

*Primary Examiner*—Brian Young
*Assistant Examiner*—John Nguyen

(57) ABSTRACT

A digital filter in an oversampling converter is tuned to compensate for the non-ideal frequency response of a transducer coupled to the converter. In the A/D path, the filter coefficients of the decimation filter in a sigma-delta converter are tuned to compensate for the transducer. In the D/A path, the filter coefficients of the interpolation filter of a sigma-delta converter are tuned to compensate for the transducer. Filter coefficients may be statically defined in circuitry or programmable from values stored in a storage memory. Compensation may also be accomplished by tuning capacitor ratios in a switched capacitor filter, which is typically integral to the D/A path of an oversampling converter.

27 Claims, 4 Drawing Sheets

SYSTEM AND METHOD FOR BANDPASS SHAPING IN AN OVERSAMPLING CONVERTER

BACKGROUND OF THE INVENTION

1. Field of the Invention

The present invention pertains generally to coded data generation or conversion and more particularly to systems and methods for conversion between analog and digital signals.

2. Description of Related Art

Transducers (e.g., speakers and microphones) have long been designed and manufactured for systems such as telephones, televisions, recorders, and stereo equipment. However, the recent proliferation of digital systems, particularly computers, that incorporate audio and/or telephony capabilities has increased demand for low cost digital-to-analog (D/A) and analog-to-digital (A/D) converters that provide high sound quality. For example, the integration of computers and audio features, as implemented in personal computer sound cards, has found popularity in education, gaming, teleconferencing, voice recognition, and many other applications. Because these applications often target home, school, and small office markets, low cost converter implementations are crucial to their success in the market. Consequently, improvements in sound quality that limit, or preferably do not require, additional components are important in these markets.

Analog and digital signal conversion is typically implemented using a codec (coder/decoder), which is a device that converts analog signals to digital to be read or stored by a computer and that converts the digital signals back to analog. Sound cards and video cards typically use this kind of codec. For example, a personal computer sound system typically requires conversion of analog signals received from a microphone into digital data for processing and storage. Likewise, such a system typically requires conversion of digital data generated by the system into analog signals for driving an audio speaker. In another example, telephone systems often incorporate both analog and digital signal processing and therefore are required to convert between analog and digital signals.

FIG. 1 depicts a typical transducer system. Microphone 104 exhibits an exemplary frequency response 101, and speaker 102 exhibits an exemplary frequency response 100. Frequency response is a term that characterizes the ratio of the amplitude of an output signal to the amplitude of an input signal (i.e., gain) over a range of frequencies. In general, sound waves are detected by the microphone 104 and an analog signal representing the input sound waves is communicated to A/D and D/A codec 106 via signal path 112. Codec 106 converts the analog signal to a digital signal, which is received by digital audio system 108 via signal path 114. In the opposite direction, a digital signal representing output sound is generated by digital audio system 108 and communicated to codec 106 via signal path 114. It should be understood that signal path 114 may share a single physical connection or be distributed among more than one connection. Codec 106 converts the digital signal to an analog signal and communicates an analog signal to speaker 102 via signal path 110.

A popular technique used in A/D and D/A conversion applications is called "sigma-delta" modulation, which is also often referred to as "delta-sigma" modulation. The terms are virtually interchangeable, with a distinction possibly being made only when the relative position of the summing (sigma) block within the modulator is being emphasized. Sigma-delta modulation is a preferred method of conversion between digital and analog signals because it achieves high-resolution by precise timing instead of by precisely-matched on-chip components, such as the resistors or capacitors used in resistive or capacitive divider techniques.

Sigma-delta codecs, which may include one or more sigma-delta modulators and filter stages, are also called oversampling converters or noise shaping converters. Oversampling and noise shaping evoke the two basic principles involved in the A/D operation of sigma-delta modulators. Oversampling spreads the quantization noise power over a bandwidth equal to the sampling frequency, which is much greater than the signal bandwidth. In noise shaping, the modulator behaves as a lowpass filter on the signal, and as a highpass filter on the noise, thus "shaping" the quantization noise so that most of the noise energy will be above the signal bandwidth. That is, the quantization noise is primarily distributed at frequencies above the relevant frequency band of the signal. A digital lowpass filtering stage, typically called a decimation filter, then removes the out-of-band quantization noise and downsamples the digital signal to the Nyquist rate.

In D/A conversion, a sigma-delta modulator receives an n-bit digital input signal. Before being received by the modulator, the digital input signal is typically filtered through a digital lowpass filter, typically called an interpolation filter, that also oversamples the signal from two times to 128 times the input sample rate. The filtered digital input signal is summed with the inverse feedback of the modulator's output signal to provide an error signal. The resulting error signal is then processed through an integrator and a comparator to provide an output signal. The output of sigma-delta modulator is an m-bit signal, where m is less than n. Typically, m=1, as this ensures linear conversion and is simpler to implement than an m≠1 device. The one-bit digital output is typically input to an analog switched capacitor filter stage to produce an analog output. In cases where m is greater than one, a more complex analog circuit is required to convert multiple digital levels into the analog output.

Speakers and microphones typically have non-ideal frequency responses. An example of a non-ideal frequency response 100 is illustrated as having a non-flat frequency response throughout the range of relevant frequencies. A speaker having a frequency response 100, for example, would produce a distorted output, where the sound at lower frequencies is louder than the sound at higher frequencies relative to the input signal received by the speaker. The decreasing portion at the higher frequency end of the frequency response 100 is called "roll-off", and the point at which the roll-off reaches 50% of the maximum amplitude in the frequency response is called the "cutoff frequency" (at 116). An ideal frequency response is flat across all relevant frequencies and contributes no distortion.

The non-ideal frequency response of a transducer results in part from physical limitations in its design and construction. In low-cost speakers and microphones used for computer telephony and other purposes, this effect is most apparent. Nevertheless, the non-ideal frequency response of a transducer may be compensated by analog and digital filters to improve the overall frequency response of a transducer system. For example, in FIG. 1, an analog filter may be placed external to the codec 106 between the codec 106 and the speaker 102. If the frequency response of the analog filter peaks in the region corresponding to the roll-off of the transducer frequency response, the filter is said to "compensate" for the transducer's non-ideal frequency response in that region. Accordingly, the resulting effective frequency response of the entire system would more closely approximate an ideal frequency response.

Many common types of converters are capable of converting between analog and digital signals, such as flash and successive approximation converters. Such converters, however, do not typically include integral filter stages and would, therefore, require the addition of one or more compensating filters to the design to compensate for the non-ideal frequency response of a transducer. Consequently, there is a need for systems and methods that improve an overall frequency response of a transducer system without requiring additional filters. The digital lowpass filtering stages of the sigma-delta modulator discussed above have traditionally been tailored to minimize noise with very specific characteristics (e.g., at a frequency outside the pass band). However, the additional use of the same digital filtering stage to compensate for the non-ideal frequency response of the transducer, particularly the overall frequency response within the pass band, has until the present invention an unpracticed method for improving other aspects of the transducer system's performance.

SUMMARY OF THE INVENTION

A system and method in accordance with the present invention permit a designer to compensate for the non-ideal frequency response of a transducer by tuning a digital or analog filter, where the filter is integral to an oversampling converter. The present invention can, for example, be utilized to provide a low-cost, high audio quality analog-to-digital and digital-to-analog converter for audio and telephony application in a personal computer environment. Furthermore, filter coefficients for an integral digital filter may be dynamically loaded from a storage memory to compensate for the variety of non-ideal frequency responses presented by various transducers.

It is therefore an advantage of the present invention that compensation for the non-ideal frequency response of a transducer is compensated in an oversampling converter without requiring an additional filtering stage.

It is another advantage of the present invention that compensation may be achieved in a converter using the tunable frequency response of an integral digital filter, an integral analog filter, or a combination of the two integral filters, without appending an additional filter stage to the converter.

Another advantage of the present invention is dynamically programming the filter coefficients of a digital filter, integral to an oversampling converter, for the purpose of dynamically compensating for the non-ideal frequency response of a transducer.

Additional objects, advantages, and novel features of the invention are set forth in the description which follows and will become more apparent to those skilled in the art when taken in conjunction with the accompanying drawings. The objects and advantages of the invention may be realized and attained by means of the instrumentalities and accommodations particularly pointed out in the appended claims.

To achieve the foregoing and other objects, in accordance with the purposes of the present invention, as embodied and broadly described herein, a system for improving an effective frequency response of a transducer in accordance with the present invention comprises an oversampling converter including a digital filter, an analog filter, a modulator coupled to the transducer for converting between analog and digital signals, at least one of the digital filter and the analog filter being tuned in combination to compensate for the non-ideal frequency response of the transducer.

The present invention may also comprise, in accordance with its object and purposes, a method comprising the operations of providing an oversampling converter including a digital filter coupled to a transducer having a transducer frequency response; and tuning at least one filter coefficient of said digital filter to compensate for said transducer frequency response.

DETAILED DESCRIPTION OF A PREFERRED EMBODIMENT

Figure 1:
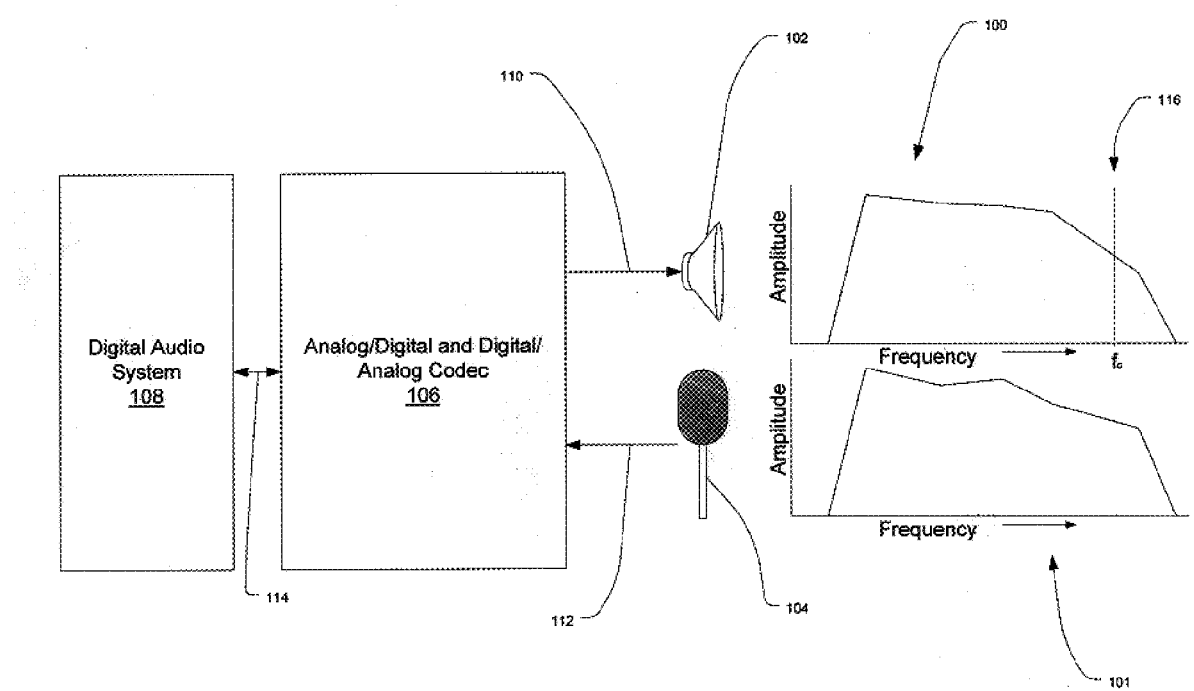
FIG. 1 depicts a transducer system coupled to a digital audio system.
Figure 2:
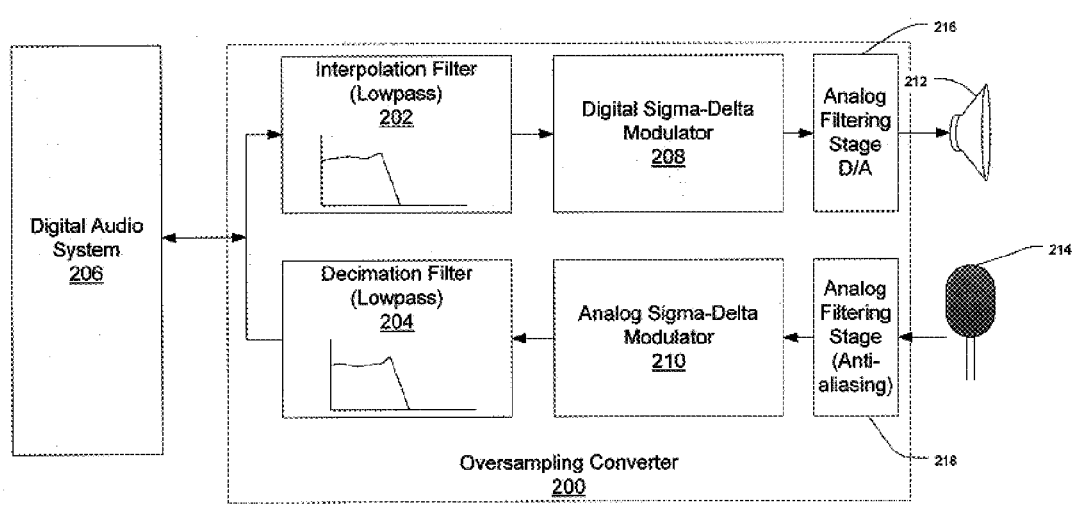
FIG. 2 depicts an oversampling converter having two sigma-delta modulators and corresponding digital filters, in accordance with the present invention.

FIG. 2 depicts an oversampling converter having two sigma-delta modulators and corresponding digital filters, in accordance with the present invention. Digital filters are typical components of an oversampling converter. In the D/A path (where the signal progresses from digital audio system 206 to speaker 212), an interpolation filter 202 typically oversamples (or "upsamples") the digital input signal from two times the input sample rate to 128 times the input sample rate. In the A/D path (where the signal progresses from microphone 214 to digital audio system 206), a decimation filter 204 filters out noise injected by the modulator and downsamples the output signal to the Nyquist rate. A detailed description of sigma-delta modulators is disclosed in "Delta-Sigma Data Converters: Theory, Design and Simulation", edited by Steven R. Norsworthy, Richard Schreier, and Gabor Temes, IEEE Press, 1997, specifically incorporated herein by reference for all that it discloses and teaches.

In the illustrated embodiment, microphone 214 is coupled to analog sigma-delta modulator 210. Analog signals from the microphone 214 are received by integral anti-aliasing filter 218 and converted by the modulator 210 into digital signals, which are then filtered by integral decimation filter 204. The filtered digital data is communicated to digital audio system 206 for processing and storage. Digital signals are also output from digital audio system 206 and filtered by integral interpolation filter 202. The filtered digital signals from filter 202 are input to digital sigma-delta modulator 208 and filtered by integral analog filtering stage 216 for conversion into analog signals to drive speaker 212. Notice that filters 202 and 204 are preferably lowpass filters, although bandpass and highpass filters are also contemplated within the scope of the invention. Furthermore, in accordance with the present invention, the frequency responses of filters 202 and 204 are tuned to compensate for the non-ideal frequency response of the transducers 214 and 212. As a result of this compensation, the effective frequency response of the transducer system, in each direction, more closely approximates an ideal frequency response.

Figure 3:
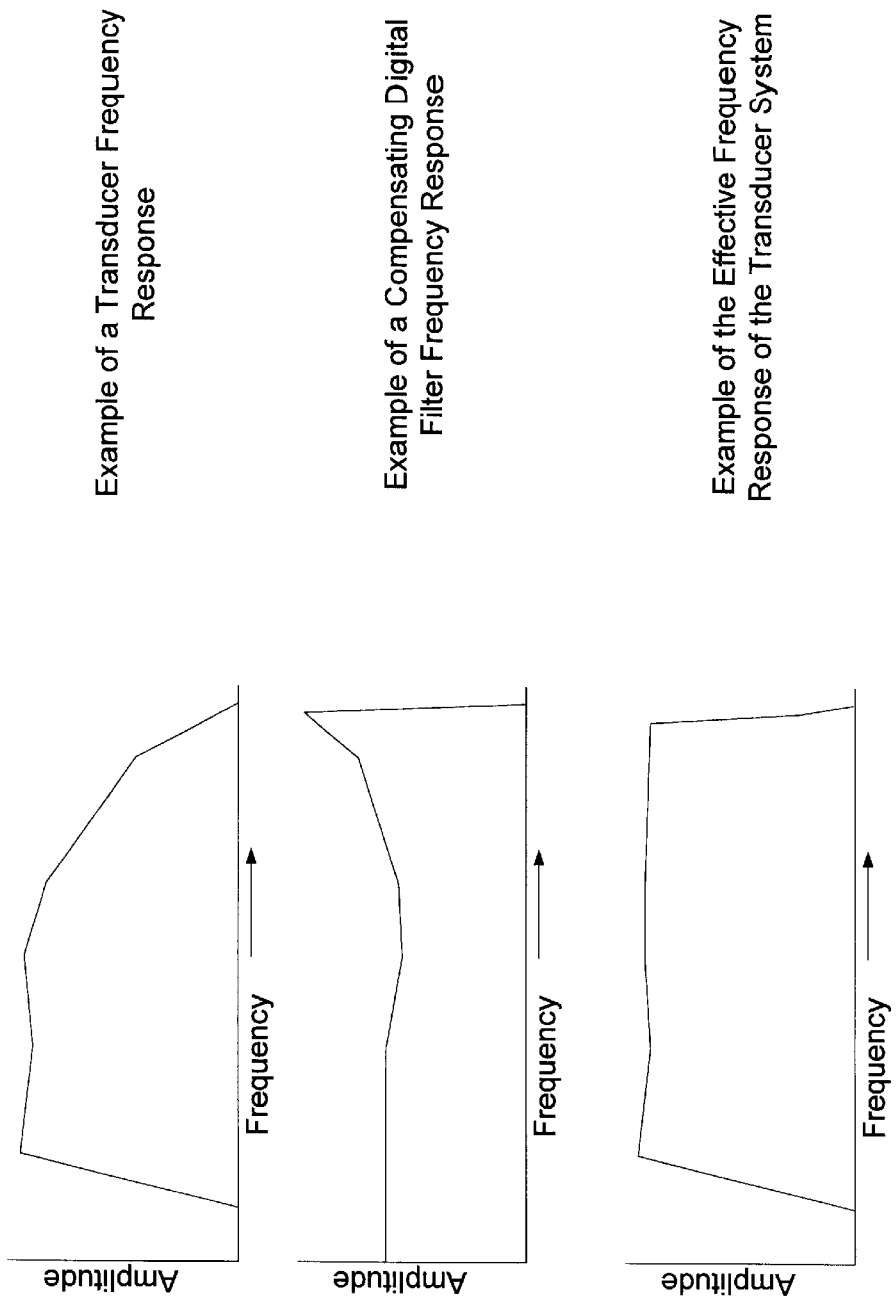
FIG. 3 depicts an example of the effective frequency response of a transducer system having a transducer and a compensating digital filter.

FIG. 3 depicts an example of the effective frequency response of a transducer system having a transducer and a compensating digital filter. The example of the transducer frequency response shows a broad roll-off region at higher frequencies and some non-flat response at middle frequencies. To compensate for these effects, the digital filter's frequency response has been shaped to compensate and cause an approximately ideal frequency response for the overall transducer system. As illustrated, the compensating filter's gain is higher in the region corresponding to the transducer's roll-off. As a result, the effective frequency response exhibits a generally flatter response and a more acute cut-off, thereby minimizing distortion. Likewise, in other non-ideal regions of the transducer's frequency response, the digital filter is tuned to compensate accordingly.

Figure 4:
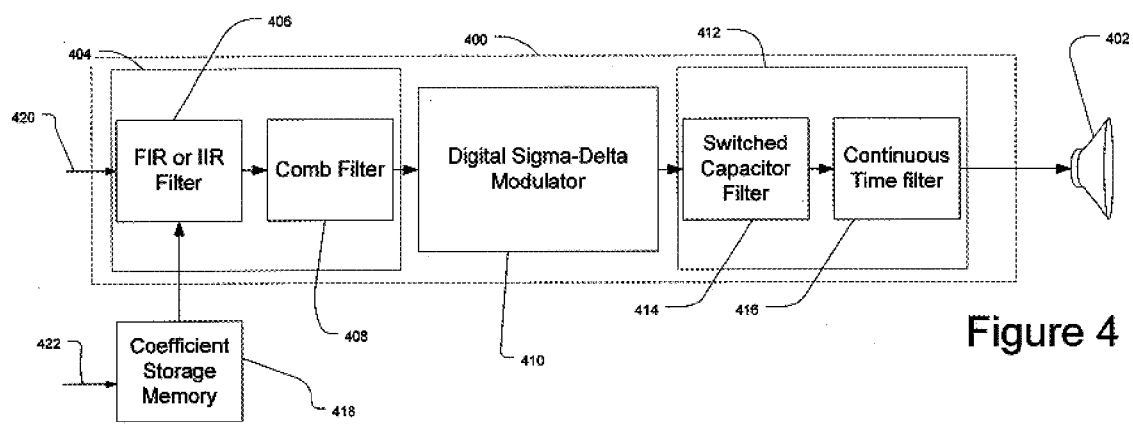
FIG. 4 depicts a more detailed block diagram of the D/A path of a transducer system.

FIG. 4 depicts a more detailed block diagram of the D/A path of a transducer system. Oversampling converter 400 is coupled to speaker 402. Interpolation filter 404 preferably includes digital filter 406 and comb filter 408. Two preferred embodiments of the digital filter 406 include without limitation a Finite Impulse Response (FIR) and an Infinite Impulse Response (IIR) filter. A FIR filter produces an output that is the weighted sum of the current input and past inputs. The weighted sum is achieved by tapping off time-delayed samples of the input signal, multiplying the samples by filter coefficients (or weights), and summing the weighted samples. A FIR filter is always stable and introduces only "zeroes" into the frequency response of the filter. In contrast, an IIR filter includes similar weighted summing (in a feedforward path), but also includes a feedback path, which introduces "poles" into the frequency response of the filter. An IIR filter necessarily has a non-linear phase and may or may not be stable. In the frequency domain, a "zero" refers to a frequency where the gain equals zero, thereby completely attenuating the input signal at that frequency. In contrast, a "pole" refers to a frequency where the gain is infinite. The frequency response of digital filter 406 is tunable by modifying its filter coefficients in accordance with techniques known in the art. In an exemplary embodiment, digital filter 406 also oversamples the digital input signal at four times the input sample rate.

A comb filter is a filter with a series of very deep notches in its frequency response where the spacings of all of the notches are at multiples of the frequency of the lowest notch (i.e., they are all harmonically related). A graph of the frequency response of a comb filter looks like a comb with evenly spaced teeth. In general, the comb filter offers a simple, inexpensive, and power thrifty design to achieve the substantial oversampling used in the oversampling converter. Comb filters are configured with simple coefficients, usually +1 or −1, and therefore, are simpler and less expensive than a more general digital filter with a similar frequency response. In an exemplary embodiment, comb filter 408 also oversamples the digital signal from sixteen times to thirty-two times the sample rate received from the digital filter 406.

The filtered digital signal is preferably received from a digital audio system via signal path 420 by digital sigma-delta modulator 410, which operates as known in the art. Generally, a sigma-delta modulator converts the oversampled, n-bit digital signal received from the interpolation filter into a m-bit digital signal, which is then received by an analog filter stage 412. Typically, m=1, as discussed above. However, if m is greater then 1, an alternate embodiment would involve an analog flash D/A converter or a digital pulse width modulator is inserted between the digital sigma-delta modulator and the integral analog filter. A one-bit digital signal is received by a switched capacitor filter 414, which preferably has a well-controlled cut-off frequency. The output of switched capacitor filter 414 is received by a continuous time filter 416, which typically has a relatively high but widely varying cut-off frequency, to smooth the analog output to speaker 402.

Typically, the frequency responses of the oversampling converter elements are merely configured to shape and filter the noise in the D/A path. In accordance with the present invention, however, the digital filter 406 and the switched capacitor filter 414 may be tuned, alone or in combination, to compensate for the non-ideal frequency response of the associated transducer. As illustrated in FIG. 3, the frequency response of digital filter 406 may be tuned to amplify the signal at frequencies where the transducer has a relatively lower gain and to attenuate the signal at frequencies where the transducer has a relatively higher gain.

For example, in a preferred embodiment, a FIR or IIR digital filter may be tuned by adjusting filter coefficients to compensate for the transducer's frequency response. Detailed description of standard FIR and IIR digital filters are disclosed in "Digital Filters and Signal Processing", Leland B. Jackson, Kluwer Academic Publishers, 1996, specifically incorporated herein by reference for all that it discloses and teaches. The coefficients may be statically defined in the circuitry of the digital filter, such as to compensate for a predetermined average frequency response curve of the supported transducers. This implementation is most advantageous when the transducers used in the transducer system have consistent frequency responses from transducer to transducer. In an alternate embodiment, the filter may be programmable by filter coefficients stored in an optional storage memory 418, preferably a non-volatile memory. In this manner, the filter coefficients could be dynamically modified to compensate for any transducer coupled to the filter. The compensation could also be altered to compensate for the frequency responses of other elements in the system (e.g., in the event of lot-to-lot variations in the frequency response of the switched capacitance filter). In an exemplary embodiment, link 422 is coupled to a CPU to program the filter coefficients into the storage memory 418.

In addition, by purposely modifying capacitor ratios in the switched capacitor filter 414, the frequency response of the filter may also be adjusted to compensate for the non-ideal frequency response of a transducer. A technique for adjusting capacitor ratios in a switched capacitor filter to achieve a predetermined frequency response is described in "Analog MOS Integrated Circuits", Roubik Gregorian and Gabor C. Temes, John Wiley & Sons, 1986, specifically incorporated herein by reference for all that it discloses and teaches. Furthermore, both the digital filter 406 and the switched capacitive filter 414 may be tuned in combination to compensate for the non-ideal frequency response of the transducer.

Figure 5:
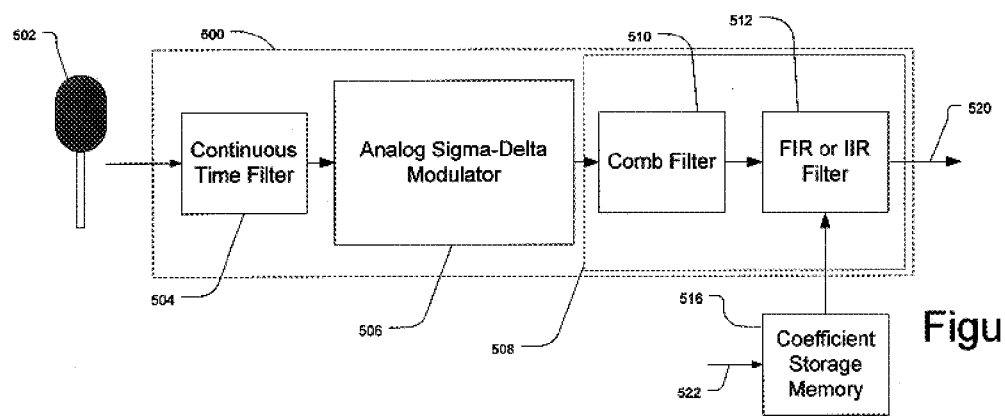
FIG. 5 depicts a more detailed block diagram of the A/D path of a transducer system.

FIG. 5 depicts a more detailed block diagram of the A/D path of a transducer system. Oversampling converter 500 is coupled to microphone 502. Continuous time filter 504 lowpass filters the analog input signal for input to analog sigma-delta modulator 506 to prevent or minimize aliasing. Decimation filter 508 preferably includes comb filter 510 and digital filter 512, as discussed above relative to the D/A path. Output signal path 520 is preferably connected to a digital system to process and store the digital data.

Typically, the comb filters of the D/A path and the A/D path are distinct circuits, preferably having different frequency responses. Two preferred embodiments of the digital filter 512 include without limitation a FIR and an IIR filter. Furthermore, the D/A and A/D paths may share the same digital filter such that digital filter 406 (in FIG. 4) and 512 are the same filter, thereby minimizing the cost of the overall device. To manage the sharing of the same circuitry, signals on the D/A and A/D paths may be time-domain multiplexed through the digital filter hardware, while often using different filter coefficients. As discussed relative to the D/A path, filter coefficients may be statically defined in the circuitry or programmable by filter coefficients stored in an optional storage memory 516. In an exemplary embodiment, link 522 is coupled to a CPU to program the filter coefficients into the storage memory 516.

When configuring the D/A and A/D sub-systems illustrated in FIGS. 4 and 5, a designer preferably determines or predicts the frequency response of the transducer to be coupled to the system. Typically the frequency response of the transducer is physically measured after manufacture using apparatus such as a spectrum analyzer or an audio analyzer. In addition, the frequency response of the transducer system may be predicted with the aid of a simulation tool. For example, a transducer's frequency response may be taken from the manufacturer's data book or from a measurement and input to a simulation tool, such as the general purpose math tool called Matlab from the Mathworks, Inc. Models of the other components in the system are also input to the simulation tool so that the designer can tune filter coefficients, either statically in the circuit or by programming means, to compensate for the non-ideal transducer frequency response. Additionally or alternately, a switched capacitor filter, typically an integral component of the oversampling converter, may be tuned to compensate for the transducer response.

While the method disclosed herein has been described and shown with reference to particular steps performed in a particular order, it will be understood that these steps may be combined, sub-divided, or re-ordered to form an equivalent method without departing from the teachings of the present invention. Accordingly, unless specifically indicated herein, the order and grouping of the steps is not a limitation of the present invention.

Moreover, while there have been described herein the principles of the present invention in conjunction with specific system and method implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. For example, it should be understood that a system in accordance with the present invention may be implemented in discrete components or multiple integrated components or may be integrated into a single integrated chip, with or without other functionality on the chip.

Although claims have been formulated in this application to particular combinations of features, it should be understood that the scope of the disclosure herein also includes any novel feature or any novel combination of features disclosed either explicitly or implicitly for any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived thereof.

What is claimed is:

1. A system for improving an effective frequency response of a transducer having a non-ideal transducer frequency response, said system comprising:

an oversampling converter including a digital filter, an analog filter, a continuous time filer, and a modulator coupled to said transducer to shape quantization noise for conversion (i) from analog to digital signals and (ii) from digital to analog signals, at least one of said digital filter and said analog filter being tuned to compensate for said non-ideal transducer frequency response, wherein said continuous time filter is coupled to said modulator and said transducer for bandpass filtering an analog signal.

2. The system of claim 1, wherein said continuous time filter is further configured for lowpass filtering of said analog signal.

3. The system of claim 1, further comprising a comb filter coupled to said modulator and said digital filter.

4. A system for improving an effective frequency response of a transducer having a non-ideal transducer frequency response, said system comprising:

an oversampling converter including a digital filter including a bandpass digital filter, said digital filter having filter coefficients tuned to compensate for said non-ideal transducer frequency response and a modulator coupled to said transducer and said digital filter to shape quantization noise for conversion (i) from analog to digital signals and (ii) from digital to analog signals.

5. The system of claim 4, wherein said digital filter further includes a lowpass digital filter.

6. The system of claim 4, wherein said digital filter further includes a finite impulse response filter.

7. The system of claim 4, wherein said digital filter further includes an infinite impulse response filter.

8. The system of claim 4, wherein said digital filter further includes an interpolation filter configured to receive a digital input signal and to output a filtered digital signal to said modulator.

9. The system of claim 8, wherein said modulator includes a sigma-delta modulator configured to shape quantization noise for conversion of said filtered digital signal to an analog output signal to be received by said transducer.

10. The system of claim 4, wherein said digital filter further includes a decimation filter configured to receive a digital output signal and to output a filtered digital signal.

11. The system of claim 10, wherein said modulator includes a sigma-delta modulator configured to shape quantization noise for conversion of an analog input signal to said digital output signal for input to said decimation filter.

12. The system of claim 4, wherein said filter coefficients are programmable.

13. The system of claim 4, further comprising:

a memory for storing said filter coefficients; and circuitry that loads said stored filter coefficients into said digital filter.

14. The system of claim 4, wherein said digital filter is used to filter both a digital input signal and a digital output signal, said digital signals being time-domain multiplexed through said digital filter.

15. The system of claim 4, wherein said oversampling converter further comprises a comb filter having a comb filter frequency response and being coupled to said digital filter and said modulator, said digital filter being tuned to compensate for a combination of said comb filter frequency response and said transducer frequency response.

16. The system of claim 15, further comprising a switched capacitor filter having an adjustable frequency response and coupled to said modulator and said transducer, said switched capacitor filter being tuned in combination with said digital filter to compensate for said combination of said comb filter frequency response and said transducer frequency response.

17. A system for improving an effective frequency response of a transducer having a non-ideal transducer frequency response, said system comprising an oversampling converter including an analog filter having at least one capacitor ratio tuned to compensate for said non-ideal transducer frequency response and a modulator coupled to said transducer and said analog filter shaping quantization noise for conversion (i) from analog to digital signals and (ii) from digital to analog signals, wherein a continuous time filter is coupled to said modulator and said transducer for filing an analog signal.

18. The system of claim 17, wherein said analog filter is a switched capacitor filter for removing noise produced by said modulator.

19. A method of improving an overall system frequency response of a transducer system, said method comprising the steps of:

providing an oversampling converter configured to provide conversion (i) from analog to digital signals and (ii) from digital to analog signals including a digital filter coupled to a transducer having a transducer frequency response, wherein said converter includes a bandpass digital filter; and tuning at least one filter coefficient of said digital filter to compensate for said transducer frequency response.

20. The method of claim 19, further comprising the step of:

measuring said transducer frequency response, said at least one filter coefficient being tuned responsive to said measuring operation.

21. The method of claim 19, further comprising the steps of:

providing an analog filter coupled to said transducer; and tuning at least one capacitor ratio in said analog filter to compensate for said transducer frequency response, in combination with said digital filter.

22. The method of claim 19, further comprising the steps of:

inputting a digital input signal to said digital filter; oversampling said digital input signal; and converting said oversampled digital input signal to an analog output signal.

23. The method of claim 22, further comprising the step of:

outputting said analog output signal to said transducer.

24. The method of claim 19, further comprising the steps of:

inputting an analog input signal to said oversampling converter;

converting said analog input signal to a digital output signal; and inputting said digital output signal into said digital filter.

25. A method of improving an overall system frequency response of a transducer system, said method comprising the steps of:

providing an oversampling converter configured to perform conversion (i) from analog to digital signals and (ii) from digital to analog signals including an analog filter coupled to a transducer having a transducer frequency response, wherein said converter includes a digital filter, an analog filter, a modulator and a continuous time filter, wherein said continuous time filter is coupled to said modulator and said transducer for bandpass filtering an analog signal; and tuning at least one capacitor ratio in said analog filter to compensate for said transducer frequency response.

26. The method of claim 25, further comprising the steps of:

inputting a digital input signal to a digital filter;

oversampling said digital input signal;

converting said oversampled digital input signal to an analog output signal; and inputting said analog output signal to said analog filter.

27. The method of claim 25, further comprising measuring said transducer frequency response, said at least one capacitor ratio being tuned responsive to said measuring operation.

* * * * *